United States Patent [19]

Telle

[11] Patent Number: 5,260,762
[45] Date of Patent: Nov. 9, 1993

[54] DEVICE FOR NON-CONTACT MEASUREMENT OF SPEED, DISPLACEMENT TRAVEL AND/OR DISTANCE

[75] Inventor: Harald Telle, Braunschweig, Fed. Rep. of Germany

[73] Assignee: Werner Tabarelli, Schaan, Liechtenstein

[21] Appl. No.: 809,476

[22] PCT Filed: Apr. 16, 1991

[86] PCT No.: PCT/AT91/00056
§ 371 Date: Dec. 18, 1991
§ 102(e) Date: Dec. 18, 1991

[87] PCT Pub. No.: WO91/16640
PCT Pub. Date: Oct. 31, 1991

[30] Foreign Application Priority Data
Apr. 18, 1990 [AT] Austria .................. 906/90

[51] Int. Cl.$^5$ ............................... G01C 3/08
[52] U.S. Cl. ............................ 356/5; 356/4.5; 356/28.5; 356/28
[58] Field of Search ............ 356/4.5, 5, 28, 28.5

[56] References Cited

U.S. PATENT DOCUMENTS

| | | | |
|---|---|---|---|
| 3,476,483 | 11/1969 | Weeks | 73/655 X |
| 3,733,129 | 5/1973 | Bridges | 356/5 |
| 3,901,597 | 8/1975 | White | 356/5 X |
| 3,950,100 | 4/1976 | Keene et al. | 356/28 |
| 3,958,881 | 5/1976 | Keene et al. | 356/5 X |
| 4,643,575 | 2/1987 | Hazeltine et al. | 356/28.5 |
| 4,655,588 | 4/1987 | Chenausky et al. | 356/5 |
| 5,069,545 | 12/1991 | Hinz | 356/28.5 |

FOREIGN PATENT DOCUMENTS 2208770 8/1987 United Kingdom.

OTHER PUBLICATIONS

Groot, P. J. et al. "Ranging and velocimetry . . . ", Applied Optics, 27(21) (1988).
Shimizu, E. T., "Directional discrimination . . . ", Applied Optics, 26(21) (1987).
Tsuchida, H. et al., "Novel ring interferometers . . . ", Applied Optics, 27(2) (1988).
Hollberg, L. et al., "Modulatable narrow . . . ", Appl. Phys. Lett., 53(11) (1988).
Kyuma, K. et al., "Semiconductor laser . . . ", Proceedings of SPIE Fiber Optic and Laser Sensors III, 566(20) (1985).

Primary Examiner—Mark Hellner
Attorney, Agent, or Firm—Lorusso & Loud

[57] ABSTRACT

The device described for the measurement, without physical contact, of the speed, displacement distance and/or range of a reflecting object has a laser diode as light source, transmission and receiver optics for aiming the laser light from the laser diode at the object and for feeding part of the laser light reflected by the object back to the laser resonator, and a detector unit for detecting and analyzing the laser light emitted by the laser diode. Fitted to determine the modulation frequency of the laser light, which is frequency-modulated as a function of the feedback to the laser resonator, is a frequency discriminator, a photodiode and a processing circuit with a spectrum analyzer.

27 Claims, 2 Drawing Sheets 5,260,762

DEVICE FOR NON-CONTACT MEASUREMENT OF SPEED, DISPLACEMENT TRAVEL AND/OR DISTANCE

BACKGROUND OF THE INVENTION

The invention relates to a device for non-contact measurement of speed, displacement travel and/or distance of a reflecting measurement object, comprising a laser, in particular a semiconductor laser, as a light source, in which the level of light intensity in the laser resonator influences the optical length thereof, a transmitting and receiving optical system for directing laser light from the semiconductor laser onto the measurement object and for feeding back a part of the laser light reflected by the measurement object into the laser resonator, and a detector means for detecting and analysing the laser light which is emitted by the semiconductor laser and which is modulated in dependency on the laser light feedback from the measurement object into the laser resonator.

It is already known to use a semiconductor laser (laser diode) as a receiver or as a "converter" for the light which returns from the measurement object, which converts individual photons which are fed back from the object into the laser resonator, into changes in the laser emission parameters (for example intensity). By virtue of that conversion procedure, it is possible, even when dealing with very weak signals from the measurement object, to obtain the measurement information from relatively high levels of optical power (fractions of the laser output power), which makes only extremely low levels of requirement in regard to the detection system to be used. The article "Ranging and velocimetry signal generation in a backscatter-modulated laser diode" by Peter J. de Groot, Gregg M. Gallatin and Steven H. Macomber in Appl. Opt. 27, No 21, 1988, pages 4475-4480, describes such a device for non-contact distance measurement of a diffusely scattering measurement object. The transmitting and receiving optical system used in that arrangement can be of a very simple design configuration and does not require an expensive adjustment operation, in contrast to conventional interferometers for length measurement purposes. The known device makes use of the fact that the light which is fed back from the measurement object into the laser resonator results in amplitude modulation of the light which is emitted by the laser diode. For distance measurement purposes, the laser diode current and therewith the optical phase in modulated, and the procedure involves looking for amplitude modulation of the output signal of the laser diode at the frequency of that phase modulation. A serious disadvantage of the known device however is the fact that measurement of speed and/or distance is possible only up to a relatively short distance of the measurement object from the laser diode (a few meters when using typical laser diodes).

OBJECT OF THE INVENTION

The object of the invention is to provide a device for non-contact measurement of speed, displacement travel and/or distance, of the kind set forth in the opening part of this specification, which is simple to set and relatively inexpensive and which has an increased level of measurement sensitivity and which thus permits measurement in respect of distance of weakly reflecting and in particular diffusely scattering measurement objects in a wide measurement range (preferably between fractions of millimeters and 50 m and more).

SUMMARY OF THE INVENTION

In accordance with the invention that is attained in that the detector means has at least one means for detecting the modulation frequency of the frequency-modulated laser light which is emitted by the semiconductor laser.

The invention is based on the realisation that semiconductor lasers (laser diodes), in response to a feedback of laser light into the laser resonator, which has a frequency which is shifted with respect to the emission frequency and a level of intensity (typically $10^{-4}$ and below) which is low in comparison with the output laser power, results in frequency modulation of the laser light emitted by the semiconductor laser. That effect generally occurs in the case of lasers, the optical resonator length of which depends on the light intensity in the resonator. The invention is further based on the realisation that analysis of frequency modulation permits substantially more sensitive detection than is the case with evaluation of the known backscatter signal-induced amplitude modulation effect. Thus, even when dealing with weak and in particular diffusely reflecting measurement objects (referred to as "non-cooperative targets") without their own optical reflector or over greater distances, it is possible to provide for accurate distance and/or speed measurement, in which respect a continuous-wave laser with a low level of power (for example in the 10 mW-range) can be used, which is advantageous in regard to endangering eyes and material loading in relation to the object. With a conventional standard laser diode, speed and/or distance measurement is possible for example with a distance of the measurement object from the laser diode of up to over 500 m, with a high degree of accuracy. In that connection the optical structure is extremely simple and insensitive to settings. In the simplest case the transmitting and receiving optical system may comprise a lens or a simple lens assembly which collimates or focuses the light beam issuing from the semiconductor laser (laser diode). The feedback of light which is backscattered from the measurement object into the laser resonator of the semiconductor laser may be effected by one and the same lens or lens assembly.

By virtue of their high level of optical gain, the related relatively low reflection coefficient in respect of the mirror surfaces which define the laser resonator, and the accordingly high entrance probability for backscattered photons, laser diodes react in a highly sensitive fashion to a feedback of light. Depending on whether the backscattered photon is or is not in phase with the laser field in the resonator, the laser field experiences instantaneous strengthening or attenuation. The balance between strengthening and losses then provides that the number of photons (intensity) again swings back to the equilibrium value. In the case of a laser diode, that occurs within fewer than $10^{-9}$ seconds. Due to that fast return regulation action, that effect can only be observed with difficulty in terms of amplitude or intensity. Now, in the case of semiconductor lasers (laser diodes), the charge carrier density and thus the emission frequency is dependent in a highly sensitive manner on the intensity of light in the resonator. The deviation in the number of photons (caused by photons which are backscattered from the object) therefore alters the frequency in the short term and thus, in the long term, when the radiation is again in a condition of equilibrium, the phase of the emitted wave. If the frequency of the light which is fed back into the laser resonator is slightly displaced, relative to the emission frequency, for example by virtue of the Doppler effect of a moving object, the relative phase position as between the laser field in the resonator and the fed-back light varies precisely at the rhythm of the differential frequency as between the emission frequency and the fed-back frequency. Because of the above-mentioned properties of semiconductor lasers (laser diodes), that results in phase or frequency modulation at the rhythm of the differential frequency (in the case of moving objects, that is precisely the Doppler shift). Because of the rapid reaction of laser diodes to interference phenomena from the exterior, they are capable, even in the event of differential frequencies in the megaherz range and above, of always reacting practically instantaneously (well-settled, quasi stable situation), whereby the differential frequency between the emitted carrier frequency and the fed-back frequency is accurately reflected in the modulation frequency of the frequency-modulated emitted radiation.

Now, for typical semiconductor lasers (laser diodes), the relative change in amplitude which is responsible for amplitude modulation is substantially less than the phase deviation, in relation to which the phase or frequency modulation which is detected in accordance with the invention is proportional. That accordingly gives a level of sensitivity which is higher in the order of magnitude of between ten and one hundred times in analysis of the frequency modulation effect, which, with the same transmitting power, involves a correspondingly greater range on the part of the device or a correspondingly better response when dealing with measurement objects which have less good reflection capability. The signal/noise ratio obtained is excellent in the detection of frequency modulation, with the shot-effect noise limitation being at least approximately attained. In spite of the high level of measurement sensitivity, the device according to the invention is insensitive to the incidence of extraneous light and can therefore be used without any difficulties even in the open air.

Detection of the backscatter signal-induced frequency fluctuation (ascertaining modulation frequency), admittedly initially represents a higher level of expenditure, in comparison with simply ascertaining amplitude modulation, as frequency modulation is not directly reflected in the level of intensity which can be detected by photodetectors. Additional devices, for example a discriminator which is also described in greater detail hereinafter, are required, which for example initially convert frequency modulation into amplitude modulation which can then be easily detected by photodetectors. However those additional devices also give rise to an important advantage as there is an additional degree of freedom (namely for example the discriminator transconductance) in designing the device. That means that the device can be adapted in a considerably better fashion to specific measurement tasks.

As already mentioned, in contrast to the known device, the device according to the invention detects not amplitude modulation but backscatter signal-induced frequency modulation of the laser light, that is to say it produces an electrical signal which reflects the frequency modulation frequency. That electrical signal can then be subjected to further processing in a connected or integrated electronic evaluation circuit of the photoelectric detector arrangement in order to be able to ascertain the desired magnitudes, distance and/or speed of the measurement object. It will be appreciated that the electronic evaluation operation may naturally also include further parameters such as the refractive index of the ambient medium, the driver frequency of an acousto-optical modulator which is still to be described, or a specific modulation frequency in respect of the transmission frequency of the laser diode. In principle evaluation may be effected both in the time domain and in the frequency domain. Evaluation in the time domain will generally amount to the use of correlation procedures, with a corresponding requirement for computation capacity, in which respect FFT (Fast Fourier Transformation) is also to be counted among such correlation procedures. Evaluation in the frequency domain may be effected either with a spectrum analyser (scanning filter spectrum analyser) or with a filter bank. While the correlation procedures are suitable in particular in relation to low frequencies, filter banks stand out with a high data through-put rate and the spectrum analyser stands out when dealing with a useful dynamic coverage.

The device according to the invention is suitable firstly for determining the speed of the measurement object, with the speed component present in the laser beam direction being ascertained. Evaluation is effected by way of the known Doppler formula which reproduces the relationship between speed and frequency shift which is reflected in the detected modulation frequency. The typical detectable speed range is approximately between a millimeter/second and some 10 m/second.

By counting of the modulation frequency, it is also possible to ascertain the displacement travel of the measurement object, in which respect interferometric accuracy is achieved in particular when dealing with optically polished measurement objects (for example mirrors).

If the transmission frequency of the laser diode is modulated, absolute distance measurement is also possible (chirp radar). Modulation of that kind is possible for example by virtue of the fact that the resonator to which the laser frequency is stabilised is modulated in a controlled fashion for example by way of piezoelectric elements. The distance d being sought is then obtained with a given transmission modulation frequency $f_{mod}$ and a given frequency deviation $\Delta v$, on the basis of the following:

$$n \cdot d = \frac{c}{\Delta v} \frac{\Delta f}{f_{mod}}$$

wherein n is the refractive index of the ambient medium, c is the velocity of light in a vacuum and $\Delta f$ is the detected modulation frequency. Typical detectable distances are in the range of between a tenth of a millimeter and about 100 m.

Firstly however an important function of the device according to the invention for detecting modulation frequency is the production of a suitable electrical signal. Since, as mentioned, frequency modulation cannot be directly detected with photodetectors, it is generally necessary to ensure that the above-mentioned frequency modulation is firstly converted into amplitude modulation which is detectable on the part of photodetectors. A frequency-modulated oscillation can be represented in known manner as the superimposition of a central carrier frequency (centre frequency) and two equal-intensity, phase-shifted side bands which are at a spacing corresponding to the modulation frequency, from the carrier frequency. If the "balance" between the carrier frequency and the two side bands of the originally purely frequency-modulated oscillation is disturbed in a high-frequency-selective procedure, by for example the carrier frequency being phase-shifted relative to the side bands or by one of the two side bands being removed, that gives rise to amplitude modulation which corresponds to the modulation frequency and which may be detected by a photodetector.

In accordance with a preferred embodiment of the invention, for that purpose it is provided that the means for detecting the modulation frequency comprises an optical arrangement, preferably an optical frequency discriminator, for producing an output radiation which is amplitude-modulated with the modulation frequency of the frequency modulation and which is detected by at least one photodetector, wherein it appears to be particularly advantageous if the frequency discriminator is an optical resonator (preferably a ring resonator) which is preferably operated in the reflection mode and the resonance frequency of which (resonance centre frequency) is just beside the carrier frequency of the frequency-modulated laser light.

The relative position of the resonance frequency of the resonator and the carrier frequency of the frequency-modulated laser light can be established either by the resonance frequency being tuned to the carrier frequency of the laser light or conversely by the carrier frequency of the laser light being tuned to the resonance frequency of the resonator, the latter alternative appearing to be more advantageous. That regulation or stabilisation at or just beside the resonance frequency can be effected by an electronic regulating means which will be described in greater detail hereinafter.

At its input mirror, the frequency discriminator which is in the form of an optical resonator operated in the reflection mode reflects the carrier frequency of the frequency-modulated light in the vicinity of a resonance with a different phase jump from the two side bands. That gives rise to amplitude modulation which can be converted by a rapid photodiode together with amplifier connected thereto, into an electrical signal. That signal can then be analysed for example in a spectrum analyser and subjected to further processing in an evaluation circuit or suitably displayed. The ring resonator which is operated in the reflection mode gives the advantage that even higher modulation frequencies (and therewith also greater speeds on the part of the measurement object) can be detected. Furthermore the ring resonator has the advantage over standing wave resonators (for example etalons) that there are practically no troublesome optical feedback effects which could be blocked off only by expensive means, for example Faraday insulators.

A preferred embodiment of the invention provides that the device according to the invention has a frequency-selective optical arrangement for producing at least one optical regulating signal which reflects the position in terms of frequency of the instantaneous frequency of the laser light with respect to a reference frequency, at least one photodetector for conversion of the optical regulating signal into an electrical regulating signal and an electronic regulating means which, in dependence on said electrical regulating signal, regulates or stabilises the carrier frequency of the semiconductor laser to the reference frequency. The frequency-selective optical arrangement is preferably formed by a ring resonator which is operated in the transmission mode and by way of whose resonance frequency or frequencies the reference frequency is fixed, to which the carrier frequency of the semiconductor laser is electronically stabilised. Per se known fast, electronic regulating means of that kind permit simple frequency regulation for example by way of regulation of the injection current of the laser diode, wherein the emission line width of the transmission frequency is considerably reduced by the above-indicated electronic stabilisation effect and thus the resolution capability of the arrangement is considerably increased.

The above-mentioned optical frequency discriminator and the frequency-selective optical arrangement for electronic regulation can be formed by one and the same optical components. For example the signal which is transmitted by a special ring resonator which is also described in greater detail hereinafter may be used for the electronic regulation effect while the reflected signal is used for ascertaining the modulation frequency.

The above-mentioned fast electronic stabilisation or regulation effect in respect of the transmission frequency of the semiconductor laser results in a reduction in the line width of the transmission frequency and thus an increase in coherence length. Furthermore, the electronic regulation action is an elegant way of permitting automatic compensation for fluctuations in the refractive index of the ambient medium which would otherwise affect the measurement result. For that purpose it is provided in accordance with the invention that the frequency-selective optical arrangement communicates with the ambient air so that the reference frequency automatically varies in dependence on the refractive index of the ambient air. If the carrier frequency of the semiconductor laser (laser diode) is regulated to that reference frequency, the air wavelength present in the ambient medium (generally air) advantageously remains constant. In such a case the frequency-selective optical arrangement may be of a static design configuration, that is to say for example in the case of a ring resonator, the position of the mirrors involved is fixed in space relative to each other. The term "communication with the ambient air" means that ambient medium is to be found in the resonator space between the mirrors so that the refractive index at that location is the same as the refractive index which is to be found outside.

When detecting the modulation frequency, depending on the range of that modulation frequency (that is to say in the case of a speed measurement operation, depending on the respective speed of the measurement object), different evaluation procedures are appropriate, which can be embodied in juxtaposed relationship in one and the same device, so that it is possible to detect the entire speed range or distance range respectively.

When dealing with low modulation frequencies (typically in the 10 MHz range and below), the measurement signal can be taken directly from the electrical regulating signal of the electronic regulating system for stabilisation of the laser diode carrier frequency. In that frequency range the electronic regulating means is still sufficiently fast as to be able to follow the modulation frequency. Therefore the electrical regulating signal accurately reflects the modulation frequency and therewith for example the speed of the measurement object. In this case the direction of movement of the measurement object can be detected by modulation of the resonator frequency to which the carrier frequency of the semiconductor laser is electronically stabilised. More specifically, the shift in the frequency of the backscattered light relative to the instantaneous laser frequency depends on whether the modulated laser frequency moves towards or away from the Doppler-shifted frequency. With a phase-sensitive detection procedure, for example with a lock-in amplifier, it is then possible to ascertain the direction of movement.

For higher speeds (greater distances) and the higher modulation frequencies which are linked therewith (typically some 10 MHz and above), the modulation frequency may be ascertained for example from the signal which is reflected by an optical ring resonator and which is detected by a photodetector and then analysed for example by a spectrum analyser. If, when effecting evaluation in that way by an optical frequency discriminator, the above-mentioned electronic regulating procedure is used for stabilisation of the laser diode carrier frequency, it is then necessary to ensure that no interference-inducing interactions occur with the electronic regulating system. In the simplest case, in accordance with a preferred embodiment of the invention, that can be achieved by the laser light from the semiconductor laser being passed through a frequency shift means between the semiconductor laser and the measurement object. Such a frequency shift means which can be formed for example by an acousto-optical modulator through which the light passes both in the outward journey and in the return causes the modulation frequency to be above the limit frequency of the electronic regulating system, thereby providing the desired decoupling effect. When the light passes through the frequency shift means once, the frequency shift caused by the acousto-optical modulator may desirably be between 10 and 100 MHz (when the light passes through twice, it is correspondingly doubled). The acousto-optical modulator further represents an attenuation member which reduces excessively high levels of power which are fed back into the laser resonator. Alternatively or in addition, it may be provided that disposed in the beam path between the semiconductor laser and the measurement object is a possibly regulated attenuation member which ensures that less than $10^{-3}$ of the output power of the semiconductor laser is fed back into same.

Besides the above-mentioned advantages the frequency shift means (acousto-optical modulator) affords in particular the advantage that it permits the direction of movement of the measurement object to be ascertained in a simple fashion. When the measurement object is at rest, the side bands of the frequency-modulated laser light lie precisely at a spacing which corresponds to the phase shift caused by the acousto-optical modulator. If now the measurement object is moved towards the device according to the invention, the side bands are then further away from the central carrier frequency, by virtue of the Doppler effect. If the measurement object moves away from the device according to the invention, that gives rise to a reduction in the effective differential frequency as between the carrier frequency and the fed-back frequency so that the side bands are now closer to the carrier frequency. The position of the side bands as detected by the device according to the invention (corresponding to the frequency-modulation frequency of the frequency-modulated laser radiation) therefore also reflects the direction of movement of the measurement object.

Further advantages and details of the invention are described in greater detail in the following specific description.

DESCRIPTION OF PREFERRED EMBODIMENT

Figure 1:
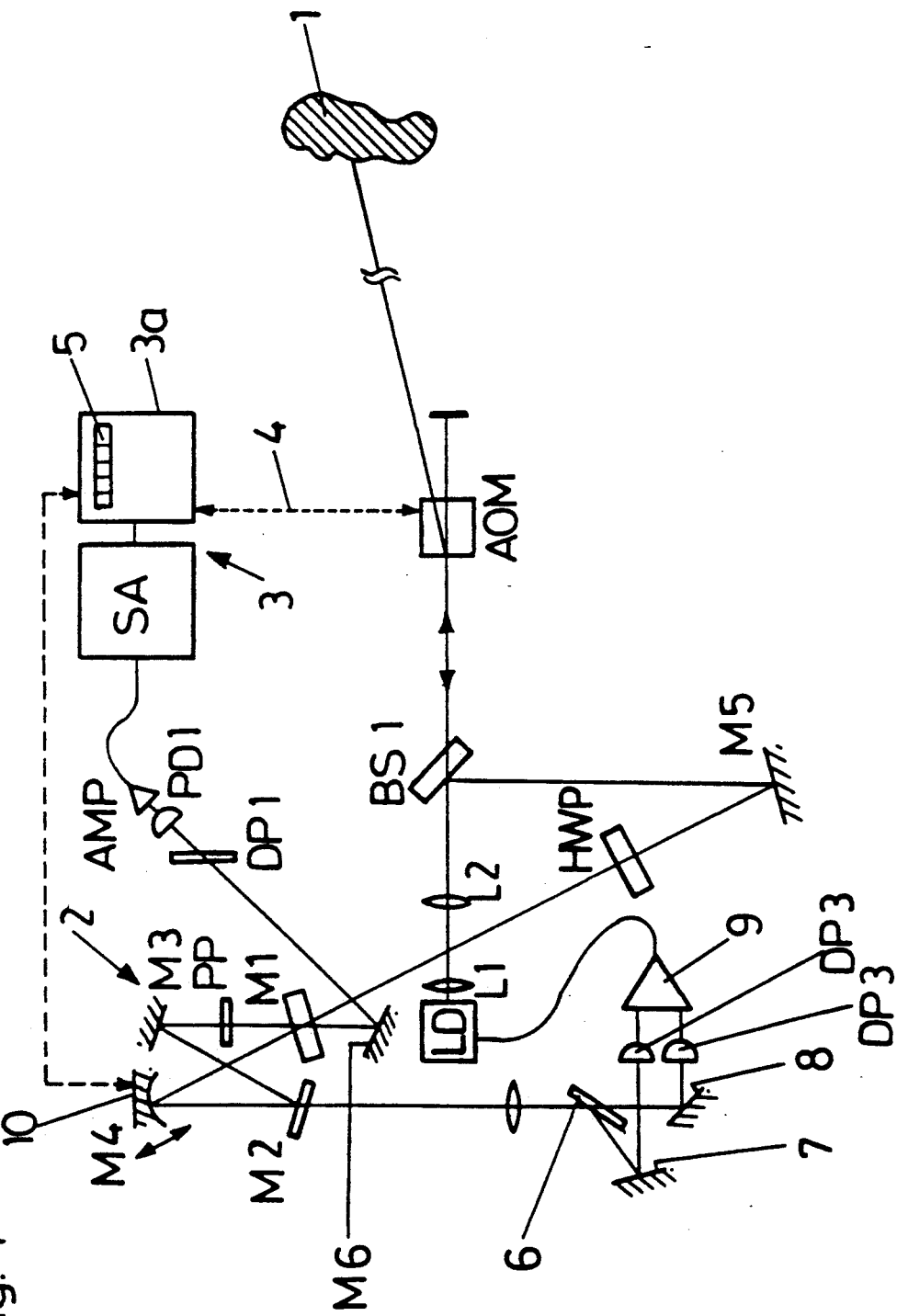
FIGS. 1 and 2 are each a diagrammatic view of a respective embodiment of the device according to the invention.

The device shown in FIG. 1 for non-contact measurement of speed and/or distance has a laser diode LD as the laser light source. By way of a transmitting and receiving optical system which in the present embodiment comprises two lenses L1 and L2, the light emitted by the laser diode goes to the measurement object by way of an acousto-optical modulator AOM. A part of the light which is reflected by the measurement object 1 goes back over the same path into the laser resonator of the laser diode LD. The acousto-optical modulator, when the light passes once therethrough, gives rise for example to a frequency shift of 80 MHz while in a corresponding fashion, when the light passes therethrough twice, it gives a shift of 160 MHz. Therefore, when the measurement object 1 is stationary, laser light which has been frequency-shifted by 160 MHz relative to the transmission frequency (carrier frequency) goes back into the laser resonator. That results in frequency modulation of the light emitted by the laser diodes, with the modulation frequency precisely corresponding to the above-mentioned differential frequency of 160 MHz (when the measurement object 1 is at rest).

If now the measurement object 1 moves, the Doppler effect gives rise to a change in that frequency shift which was caused by the acousto-optical modulator, in which case the difference between the carrier frequency and the fed-back frequency rises when the measurement object 1 is moving towards the device and falls when the measurement object 1 is moving away from the device. The modulation frequency of the frequency-modulated radiation of the laser diode therefore reflects the direction of movement, as well as the speed of the measurement object. In accordance with the invention there is provided a means for detecting the modulation frequency of the frequency-modulated laser light which is emitted by the semiconductor laser (laser diode LD). The essential optical component of that arrangement is the optical frequency discriminator 2 which in the present embodiment is a ring resonator which is operated in the reflection mode. In the present embodiment the resonance frequency of the ring resonator 2 is slightly polarisation-dependent, that is to say the resonance frequency for polarisation of the laser light is just beside the resonance frequency for the other polarisation effect which is normal thereto. Therefore (for two different polarisation effects) there are two resonance frequencies. The resonance centre frequency of the one polarisation effect is in that respect so close to the resonance centre frequency of the other polarisation effect that the two resonance centre frequencies each lie within the resonance line width of the respective other polarisation effect ("partially overlapping resonance curves"). The carrier frequency of the frequency-modulated laser light is between the two above-mentioned resonance centre frequencies. The ring resonator has four dielectric mirrors M1, M2, M3 and M4. The discriminator characteristic width (resonance line width) is in the region of some 10 MHz.

The frequency-modulated light issuing from the laser diode passes by way of a beam splitter BS1, a mirror M5 and a half-wave plate HWP by way of the coupling-in mirror M1 into the ring resonator. Now the important consideration is that that ring resonator which is operated in the reflection mode reflects the carrier frequency on the one hand and the two side bands of the frequency-modulated radiation on the other hand, with a different phase jump. That disturbance in the "balance" between the carrier frequency and the two side bands results in amplitude modulation in the reflected light, the modulation frequency of which precisely corresponds to the frequency-modulation frequency. After reflection at the mirror M6 and after transmission of the radiation through the dielectric polariser DP1, that amplitude modulation can be converted by the fast PIN-photodiode PD1 into an electrical signal which reflects that modulation frequency. By way of a universal amplifier AMP, that signal passes into an evaluation device 3 which has a spectrum analyser SA. The spectrum analyser may have connected thereto a computing and evaluation device 3a which, from the detected modulation frequency and further parameters (such as for example the driver frequency, which is supplied by way of the line 4, of the acousto-optical modulator), can ascertain the speed of the measurement object 1, on the basis of the known Doppler formula; and can display same by way of the display means 5.

When the carrier frequency of the laser diode LD is fixed, the present device shown in FIG. 1 operates as a speed measuring means. For precisely fixing the carrier frequency of the laser diode, the arrangement has an electronic regulating means which is described in greater detail hereinafter. The ring resonator 2 represents a frequency-selective optical arrangement which is such as to output an optical regulating signal which reproduces the position in terms of frequency of the instantaneous frequency of the laser light with respect to a reference frequency which is determined by the resonance frequency or frequencies. In the case of the resonator which is operated in the transmission mode, that optical regulating signal issues by way of the mirror M2. The optical regulating signal is converted by photodetectors DP2 and DP3 into respective electrical regulating signals. Now, in dependence on those electrical regulating signals, the electronic regulating means 9 regulates the carrier frequency of the laser diode LD and stabilises it to a reference frequency which is between the two polarisation-dependent resonance frequencies which are predetermined by the ring resonator 2. The plane-parallel glass plate PP is slightly doubly refractive by virtue of a lateral pressure. In that way the polarisation dependency of the resonator modes can also be finely tuned. In the polarisation beam splitter 6, the beam is divided up in accordance with two mutually perpendicular polarisation effects, which pass by way of mirrors 7 and 8 to the above-mentioned photodetectors DP2 and DP3. The electrical regulating means essentially has a difference-forming means between the two photodetector signals. If the two resonance curves are so shifted that the resonance centre frequencies are a full half-value width apart, then subtraction of the two resonance curves in the difference-forming means results in a "discriminator characteristic", in accordance with which clear regulation is possible in both directions.

As can be seen from FIG. 1 therefore the special ring resonator in the reflection mode performs the function of a frequency discriminator for determining the modulation frequency while in the transmission mode it performs the function of a frequency-selective optical arrangement for producing an optical regulating signal which permits stabilisation of the carrier frequency of the laser diode at a reference frequency which is between the two polarisation-dependent resonance frequencies of the ring resonator. In principle it would also be possible to consider operating with only one resonance curve and to effect edge stabilisation there, in order to stabilise the carrier frequency to a value which is beside the resonator centre frequency.

If the ambient medium (generally air) is between the mirrors M1, M2, M3 and M4 of the ring resonator 2, the resonance frequency or frequencies and therewith the reference frequency alter automatically with the varying refractive index of the ambient medium. That also alters the carrier frequency of the laser diode which in fact is precisely stabilised to that reference frequency by way of the electronic regulating system, precisely so that the wavelength in the ambient medium (air wavelength) remains constant. Fluctuations in environmental conditions are thus automatically compensated.

In order to ascertain the distance of the measurement object 1 from the device according to the invention, the transmission frequency of the laser diode LD can be preferably periodically modulated (for example in respect of time in a sawtooth form in the kHz-range), with the frequency deviation being for example 100 GHz. The modulation frequency which is detected by the device according to the invention then depends in per se known manner (chirp radar) on the distance of the measurement object 1. Modulation of the transmitting frequency can be effected in an elegant fashion by the reference frequency to which the carrier frequency of the laser diode is electronically stabilised being periodically altered. That is possible for example by the mirror M4 of the ring resonator 2 being periodically displaced by a piezoelectric element 10. The driver frequency of the piezoelectric element 10 is advantageously passed to the evaluation device 3.

Finally, in relation to the embodiment shown in FIG. 1, it should also be mentioned that the relatively simple transmitting and receiving optical system (L1, L2) produces a slightly convergent measurement beam, at the intermediate focus of which is arranged the acousto-optical modulator AOM.

Figure 2:
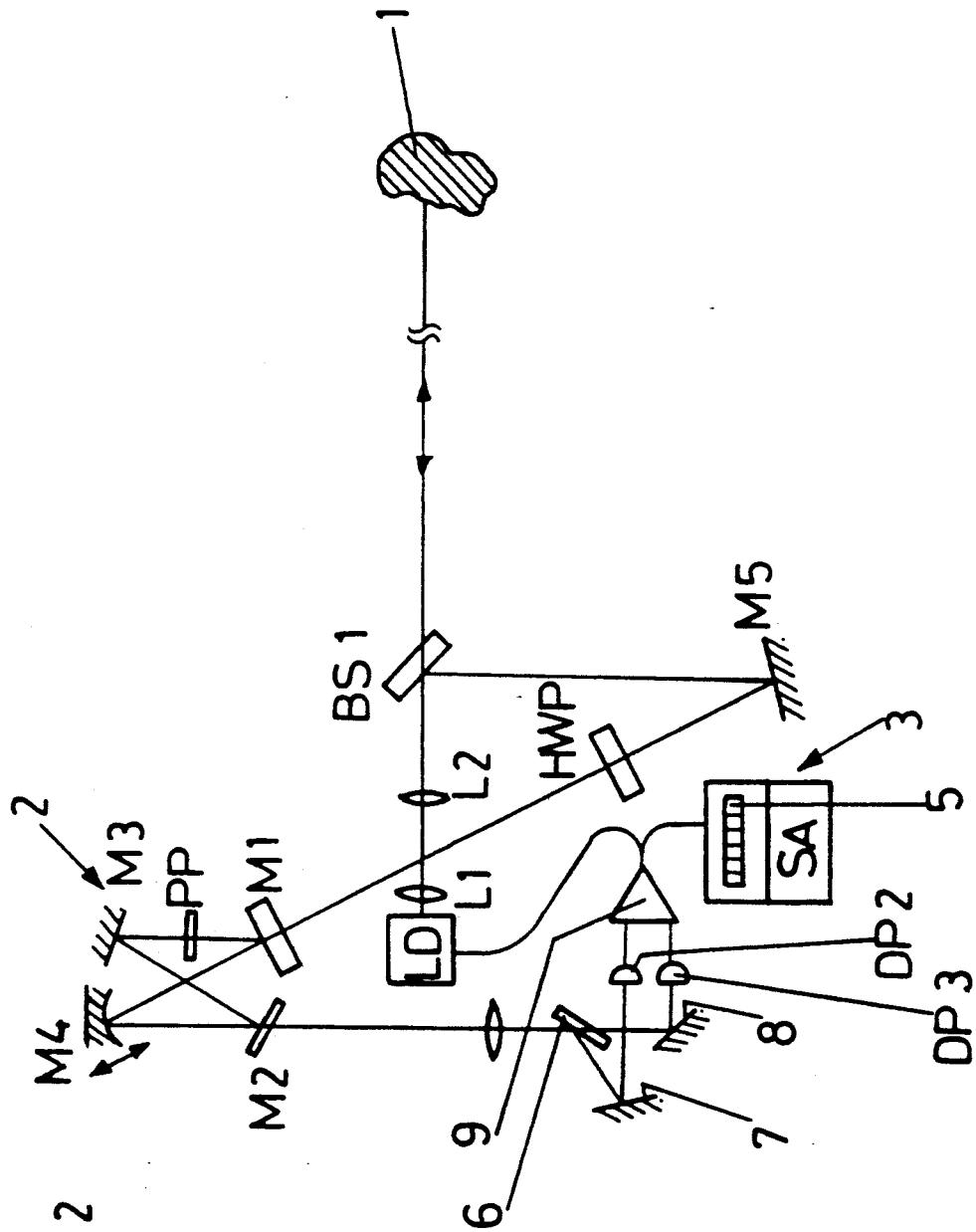

FIG. 2 shows a simplified embodiment which is particularly suitable for the measurement of slower speeds (or shorter distances). The optical structure essential corresponds to that shown in FIG. 1. The system only does not have an acousto-optical modulator AOM. As a result, when the object is at rest, the transmitting frequency of the laser diode LD is the same as the frequency of the fed-back light. If the measurement object 1 moves, there is a differential frequency between the transmitting frequency and the fed-back frequency, in accordance with the known Doppler effect. When the regulating means 9 is switched off, that results directly in frequency modulation of the light which is emitted by the laser diode LD and which is reflected in the optical regulating signal which issues from the ring resonator by way of the mirror M2. When the electronic regulating means 9 is switched on, it seeks to regulate out the return beam signal-induced frequency modulation effect, the modulation frequency being reflected in the electrical regulating signal. Therefore an evaluation circuit 3 which comprises a spectrum analyser SA and a display 5 can ascertain the speed of the measurement object 1, from that electrical regulating signal.

It will be appreciated that the invention is not restricted to the illustrated embodiments. For example, an additional attenuation member (not shown) may be provided in the beam path in order to avoid in terms of power excessive feed-back effects (over $10^{-3}$ of the output power of the laser diode). Besides electronic stabilisation or regulation of the carrier frequency of the laser diode, there is in principle also the option of stabilisation by an optical feedback effect (for example from an etalon).

I claim:

1. A device for non-contact measurement of speed, displacement, or distance of a reflecting measurement object, comprising a laser, having a laser resonator, in which the level of light intensity influences the optical length thereof, a transmitting and receiving optical system for directing laser light from the laser onto the measurement object and for feeding back a part of the laser light reflected by the measurement object into the laser resonator, and a detector means for detecting and analysing the laser light which is emitted by the laser and which is modulated in dependency on the laser light feedback from the measurement object into the laser resonator, wherein the detector means has at least one means for detecting the modulation frequency of a frequency modulation of the laser light emitted by the laser.

2. A device according to claim 1 characterised in that the means for monitoring the modulation frequency has an optical arrangement, preferably an optical frequency discriminator, for producing an output radiation which is amplitude-modulated with the modulation frequency of the frequency modulation and which is detected by at least one photodetector.

3. A device according to claim 2 characterised in that the frequency discriminator is an optical resonator which is preferably operated in the reflection mode, in particular a ring resonator, wherein the carrier frequency of the frequency-modulated laser light lies within the resonance line width, preferably beside the resonance centre frequency of a resonance of the ring resonator.

4. A device according to claim 3 characterised in that the resonator has dielectric mirrors.

5. A device according to claim 2 characterised in that the discriminator characteristic width (resonance line width) lies in the 10–1000 MHz-range.

6. A device according to claim 1 characterised in that it has a frequency-selective optical arrangement for producing at least one optical regulating signal which reflects the instantaneous position of the frequency of the laser light with respect to a reference frequency, at least one photodetector for conversion of the optical regulating signal into an electrical regulating signal and an electronic regulating means which in dependence on said electrical regulating signal regulates or stabilises the carrier frequency of the semiconductor laser to the reference frequency.

7. A device according to claim 5 characterised in that the frequency-selective optical arrangement is an optical resonator, preferably a ring resonator which is operated in the transmission mode and the resonance frequency of which defines the reference frequency.

8. A device according to claim 7 characterised in that the resonance centre frequency of the resonator depends on polarisation of the light, wherein the resonance centre frequencies for two mutually perpendicular polarisation effects are disposed in side-by-side relationship and each within the resonance line width of the respective other polarisation effect, and that disposed downstream of the resonator is a polarisation beam splitter, a beam splitter with downstream-disposed polarisers or the like for dividing the optical regulating signal into two beam portions of different polarisation, wherein the beam portions are detected by separate photodetectors.

9. A device according to claim 8 characterised in that the electronic regulating means has a means for forming a difference between the two photodetector signals.

10. A device according to claim 6 characterised in that the frequency-selective optical arrangement communicates with the ambient air so that the reference frequency varies automatically in dependence on the refractive index of the ambient air.

11. A device according to claim 1 characterised in that the optical frequency discriminator and the frequency-selective optical arrangement for electronic regulation are formed essentially by one and the same optical components.

12. A device according to claim 6 characterised in that an electronic evaluation circuit analyses the electrical regulating signal provided for electronic regulation of the carrier frequency of the semiconductor laser to the reference frequency and ascertains therefrom the speed, the displacement travel and/or the distance of the measurement object.

13. A device according to claim 1 characterised in that the transmission frequency of the semiconductor laser is varied deliberately and preferably periodically.

14. A device according to claim 13 characterised in that the frequency of variation in the transmission frequency which is preferably of a sawtooth form in respect of time is in the kHz-range and the frequency deviation is in the range of 1–100 GHz and above.

15. A device according to claim 6 characterised in that the reference frequency of the frequency-selective optical arrangement is variable deliberately, preferably periodically.

16. A device according to claim 15 characterised in that provided for reference frequency adjustment are electro-optical elements or elements which vary the geometrical position of components of the optical arrangement, in particular piezoelectric elements.

17. A device according to claim 1 characterised in that the laser light from the semiconductor laser is passed through a frequency shift means between the semiconductor laser and the measurement object.

18. A device according to claim 17 characterised in that the frequency shift means is an acousto-optical modulator.

19. A device according to claim 18 characterised in that the frequency shift is between 10 and 100 MHz, when the laser light passes once through the frequency shift means.

20. A device according to claim 1 characterised in that the beam which is directed onto the measurement object issues in a slightly convergent condition from the transmitting and receiving optical system.

21. A device according to claim 20 characterised in that the frequency shift means is arranged at the intermediate focus of the convergent output beam.

22. A device according to claim 1 characterised in that arranged in the beam path between the semiconductor laser and the measurement object is a possibly regulated attenuating member which ensures that less than $10^{-3}$ of the output power of the semiconductor laser is fed back into same.

23. A device according to claim 1 characterised in that arranged in the beam path of the laser light issuing from the semiconductor laser is a beam splitter which branches off a part of the laser light to the detector means.

24. A device according to claim 1 characterised in that the detector means includes an electronic evaluation means for ascertaining and displaying speed and/or distance of the object being measured from the detected modulation frequency of the frequency-modulated laser light and possibly from further parameters such as for example the refractive index of the ambient medium, the driver frequency of the acousto-optical modulator and/or the modulation frequency of the transmission frequency.

25. A device according to claim 24 characterised in that the evaluation means has a spectrum analyser.

26. The device according to claim 1, wherein the laser is a semiconductor laser.

27. A device for non-contact measurement of speed, displacement or distance of a reflecting measurement object, comprising a laser with a laser resonator in which the level of light intensity in the laser resonator influences the optical length thereof, a transmitting and receiving optical system for directing laser light from the laser onto the measurement object and for feeding back a part of the laser light reflected by the measurement object into the laser resonator, and a detector means for detecting and analysing the laser light which is emitted by the laser and which is changed in dependency on the laser light feedback from the measurement object into the laser reasonator, wherein the detector means has at least one means for detecting changes in the frequency of the laser light emitted by the laser.

* * * * *